United States Patent [19]
Lee

[11] Patent Number: 5,970,094
[45] Date of Patent: Oct. 19, 1999

[54] ADAPTIVE EQUALIZER EMPLOYING FILTER INPUT CIRCUIT IN A CIRCULAR STRUCTURE

[75] Inventor: Duck Myung Lee, Kyoungki-do, Rep. of Korea

[73] Assignee: Hyundai Electronics Industries Co., Ltd., Ichon, Rep. of Korea

[21] Appl. No.: 08/964,758

[22] Filed: Nov. 5, 1997

[30] Foreign Application Priority Data

Nov. 6, 1996 [KR] Rep. of Korea ................ 96-52480

[51] Int. Cl.[6] .............................. H03H 7/30; H03H 5/00; G06F 17/10
[52] U.S. Cl. .................... 375/236; 364/724.2; 333/28 R
[58] Field of Search .................... 375/229, 230, 375/232, 236; 333/18, 28 R; 364/724.011, 724.012, 724.16, 724.19, 724.2

[56] References Cited

U.S. PATENT DOCUMENTS

| | | | |
|---|---|---|---|
| 4,483,009 | 11/1984 | Honda et al. | 375/235 |
| 4,811,360 | 3/1989 | Potter | 375/229 |
| 4,969,163 | 11/1990 | Ungerboeck | 375/235 |
| 5,530,721 | 6/1996 | Inoue et al. | 375/232 |

*Primary Examiner*—Stephen Chin
*Assistant Examiner*—Albert Park
*Attorney, Agent, or Firm*—Jacobson, Price, Holman & Stern, PLLC

[57] ABSTRACT

An equalizer for filtering a received signal to generate a filtered signal. The equalizer includes: data supply means, receiving the filtered signal, for generating N number of window data samples on a symbol-by-symbol basis by using (N+1) number of delay means arranged in a circular structure, N being a positive integer; multiply means for multiplying a window data sample with a current filter coefficient to generate a multiplied sample; accumulation means for accumulating the multiplied output sample to generate an accumulated sample; decision means for determining whether the accumulated sample approximates a desired sample and, if so, for generating a filtered data sample based on the accumulated sample; error generation means for generating an error value based on an error signal, the current filter coefficient and the current window input sample, wherein the error signal represents a difference between the accumulated sample and the desired sample; and filter coefficient supply means, having N number of delay means, for subtracting the error signal from the current filter coefficient to generate the updated filter coefficient and providing the updated filter coefficient as the current filter coefficient.

4 Claims, 4 Drawing Sheets

ADAPTIVE EQUALIZER EMPLOYING FILTER INPUT CIRCUIT IN A CIRCULAR STRUCTURE

FIELD OF THE INVENTION

The invention relates to an adaptive equalizer employing a least mean square(LMS) algorithm; and, more particularly, to an adaptive equalizer for effectively providing a series of input data samples and corresponding filter coefficients used in the filtering operation without using a conventional complex filter control circuit.

DESCRIPTION OF THE PRIOR ART

In a conventional commutation system, digital data from a data signal transmission source is transmitted over a transmission channel such as a cable channel to a data signal receiving end. One of the inherent problems associated with the transmission of data signals over the transmission channel is that channel distortions and additive noises tend to disrupt, e.g., data symbols contained in the transmitted data signal, thereby adversely affecting the ability of the data signal receiving system to distinguish the received symbol levels. To ameliorate this problem, a typical data signal receiving system includes a channel adaptive equalizer.

Referring to FIG. 1, there is shown a prior art channel adaptive equalizer which employs an input data memory 1 and filter coefficient memory 2 as a filter input circuit, a filter coefficient updater 3, a filtering block 10, and a control circuit 4. The input data memory 1 receives an input data signal, which includes a plurality of input data samples, to sequentially provide a set of window data samples for each data sample to be filtered under the control of the control circuit 4. The filter coefficient memory 2 serves to store updated filter coefficients outputted from the filter coefficient updater 3 to sequentially provide the updated filter coefficients as a corresponding set of filter coefficients to the filtering block 10 under the control of the control circuit 4. The filtering block 10 includes a multiplier 5 as a filter tap, an adder 6 as an accumulator, and a flip-flop 7; and serves to generate a filtered data sample by using the set of window data samples and the corresponding set of updated filter coefficients, thereby generating a filtered signal. The filtered signal has a plurality of filtered data samples corresponding to the input data samples.

The input data and the filter coefficient memories are generally implemented by using a random access memory (RAM). In order to perform an iterative filtering operation by using the multiplier and the adder, the window data samples and the corresponding filter coefficients are sequentially provided from the two memories, as the filter input circuit, under the control of the control circuit. In this case, however, it is difficult to implement the simple and cost effective control circuit for addressing and timing the memories. It would be, therefore, more advantageous and desirable in terms of cost and speed to design a filter input circuit for sequentially providing the window data samples and the filter coefficient in an effective manner.

SUMMARY OF THE INVENTION

It is, therefore, a primary object of this invention to provide an improved adaptive equalizer for effectively providing a series of input data samples and corresponding filter coefficients used in the filtering operation by using a circular structure, without using a conventional complex filter control circuit.

In accordance with the invention, there is provided an equalizer for filtering a received signal to generate a filtered signal, wherein the received signal includes a plurality of data samples and the filtered signal includes a corresponding plurality of filtered data samples, said the equalizer comprising: data supply means, receiving the filtered signal, for generating N number of window data samples on a symbol-by-symbol basis by using (N+1) number of delay means arranged in a circular structure, N being a positive integer; multiply means for multiplying a window data sample with a current filter coefficient to generate a multiplied sample; accumulation means for accumulating the multiplied output sample to generate an accumulated sample; decision means for determining whether the accumulated sample approximates a desired sample and, if so, for generating a filtered data sample based on the accumulated sample; error generation means for generating an error value based on an error value, the current filter coefficient and the current window input sample, wherein the error signal represents a difference between the accumulated sample and the desired sample; and filter coefficient supply means, having N number of delay means, for subtracting the error signal from the current filter coefficient to generate the updated filter coefficient and providing the updated filter coefficient as the current filter coefficient.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 1:
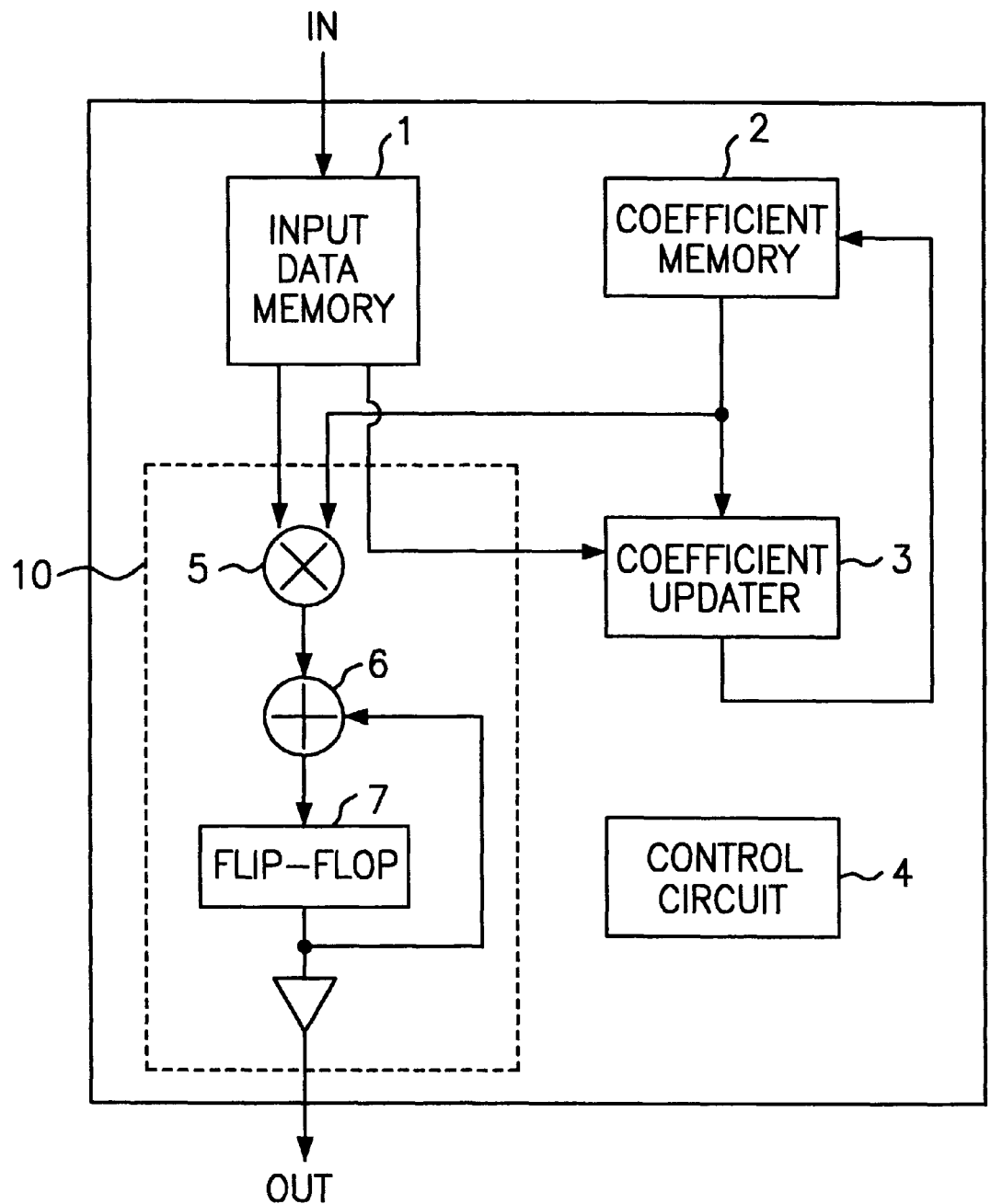
FIG. 1 represents a schematic block diagram of a conventional channel adaptive equalizer employing a least mean square(LMS) algorithm.
Figure 2:
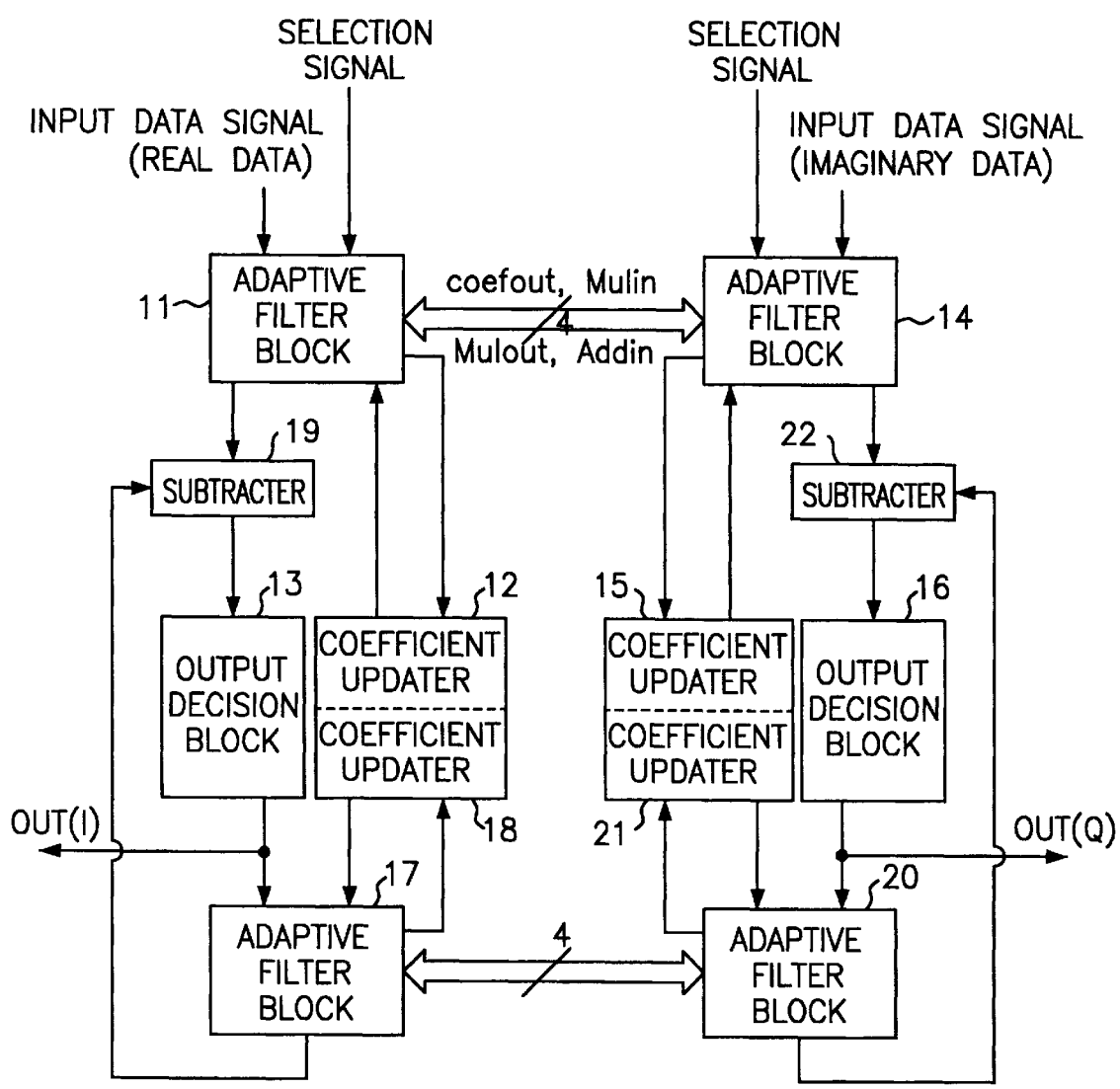
FIG. 2 shows a schematic block diagram of an adaptive equalizer in accordance with the present invention.

Referring to FIG. 2, there is shown a schematic block diagram of an adaptive equalizer in accordance with the present invention. The adaptive equalizer includes adaptive filter blocks 11, 14, 17 and 20, filter coefficient updaters 12, 15, 18 and 21 , output signal decision blocks 13 and 16.

As shown, the adaptive equalizer is implemented by employing two equalization parts, wherein one has two adaptive filter blocks 11 and 14, two filter coefficient updaters 12 and 15 and two output decision blocks 13 and 16; and the other contains two adaptive filters 17 and 20, two filter coefficient updaters 18 and 21, and two subtracters 19 and 22. As a result, the adaptive equalizer can be operated as an known infinite impulse response (IIR) type adaptive equalizer through the use of the above two parts.

The adaptive filter blocks 11 and 14 are arranged in a symmetric array. That is, the adaptive filter 11 serves to filter real data samples of input data signal, while the adaptive filter block 14 serves to filter imaginary data samples thereof. The output decision blocks 13 and 14 receive outputs from the subtracters 13 and 16, respectively, and determine whether the outputs are assigned as an equalizer output signal that approximates an original non-distorted input data signal prior to its transmission.

Figure 3:
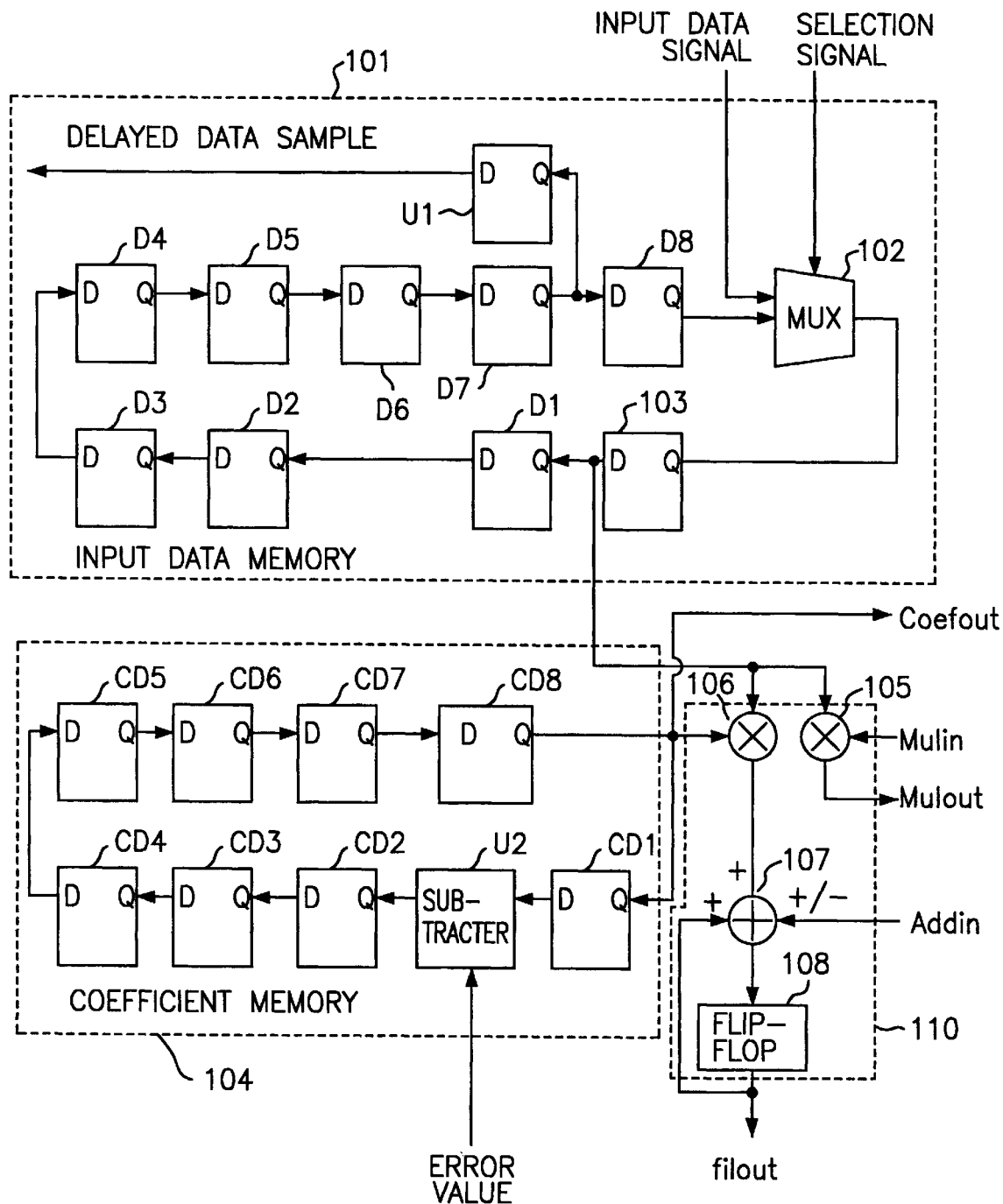
FIG. 3 illustrates a detailed block diagram of the adaptive filter block shown in FIG. 2.

As can be seen from the above, the adaptive filter blocks 11 and 14 can be implemented by using a same filter structure. Accordingly, for the sake of convenience, the description hereinafter is directed to the filter block 11. Referring to FIG. 3, there is illustrated a detailed diagram of the adaptive filter block shown in FIG. 2.

A received input data signal is sampled by a known sampling circuit into a plurality of input data samples. The plurality of data input sample are sequentially coupled to the adaptive filter block 11 shown in FIG. 2. The adaptive filter block 11 is comprised of a finite impulse response(FIR) filter 110 and a filter input circuit having an input data memory 101 and a filter coefficient memory 104. The input data signal is supplied via the input data memory 101 to the filter 110 in which it is filtered and equalized by using the set of filter coefficients from the filter coefficient memory 104 in order to produce a filtered signal. The filtered signal includes a corresponding plurality of filtered data samples which are sequentially coupled to the filter coefficient updater 12 and also coupled via the subtracter 19 to the output decision block 13.

Assuming that fc=nfs, wherein a sampling frequency is fs(=1/T) and a clock frequency is fc(=1/t), an output F of the filter 110 is calculated as follows:

$$F = \sum_{k=0}^{N-1} I(x - kT) \times C(kT)$$

wherein I is an input signal, C is an updated filter coefficient; and N is a positive integer.

As may be seen from the above equation, a finite impulse response filter performs a filtering process for each target input data sample by sequentially multiplying N number of window data samples with N number of filter coefficients, respectively, and accumulates the multiplied data samples during a predetermined time T in order to generate a filtered data sample. The process is repeated to thereby generate a filtered data signal.

Therefore, in accordance with the present invention, the input data samples are sequentially delayed by using (N+1) number of delay means arranged in a circular structure in order to generate N number of window data samples for each target input data sample in a sample-by-sample basis. On the other hand, in order to perform a window shifting operation, (N+1)th delay means is coupled to Nth delay means in a parallel fashion. As a result, Nth delayed data sample of the window data sample, i.e., a first current window data sample, is relayed to the filter coefficient updater 12 as a current window data sample. While a newly inputted data sample is supplemented to the current window samples by using the multiplexer 102 to thereby form a new set of window input data samples for another target input data sample. As a result, a simple structure of a least means square(LMS) adaptive filter can be effectively obtained.

In accordance with a preferred embodiment of the present invention, as shown in FIG. 3, the input data memory 101 is implemented by using N number, e.g., 8, of D flip-flops D1 to D8 arranged in a circular structure and an (N+1)th D flip-flop U1 coupled to an Nth D flip-flop D8 in a parallel fashion. As a result, the input data samples are sequentially relayed to a multiplier 106 which select the input data sample or output from the D flip-flop D8 in response to a selection signal. The selection signal can be relayed from a known system controller(not shown). The selected input data sample is then relayed vi D flip-flop 103 to the a first delay means, i.e., a D flip-flop D1 and the multipliers 106 and 107. In a similar manner, the selected input data samples are sequentially delayed by using the D flip-flops D1 to D8. As a result, a current set, e.g., 8, of window data samples are sequentially supplied to the multiplier during the predetermined time T. An eighth delayed data sample is vi D flip-flop U1 to the filter coefficient updater 15 shown in FIG. 2 as a current window data sample. On the other hand, as described above, in stead of the eighth delayed data, a new input data sample is then supplemented to the current set of window data samples to thereby form a new set of the window data samples. The operation will be continued until all data samples contained in the input data signal is filtered.

On the other hand, the filter coefficient memory 104 is implemented by using N number, e.g., 8, of D flip-flops CD1 to CD8 arranged in a circular structure. A subtracter U2 is connected between a first and second D flip-flops CD1 and CD2. As a result, the filter coefficients are delayed by using the D flip-flops CD1 to CD 8 and a delayed filter coefficient output from the 8th D flip-flop CD8 is coupled to the multiplier 106 and a first D flip-flop CD1. The delayed filter coefficient is synchronized with the delayed window data sample by using the same clock signal and also, as designated by "Coefout", relayed to the adaptive filter 14 shown in FIG. 2. The subtracter U2 serves to generate an updated filter coefficient by subtracting a filter coefficient outputted from the first D flip-flop CD1 with an error value outputted from the filter coefficient updater 12 shown in FIG. 2. The updated filter coefficient is then fed to the second D flip-flop CD2; delayed through the use of D flip-flops CD2 to CD8 in order to provide to the multiplier 106 when the corresponding window data sampled is applied thereto.

At the multiplier 106, the window data sample is multiplied by the corresponding filter coefficient to generate a multiplied data sample. The multiplied data sample is then relayed vin adder 107 to a flip-flop 108 which form an accumulator for accumulating the multiplied data sample to thereby generate a filtered data sample. The filtered data sample is then relayed to the filter coefficient updater 12 and via subtracter 13 to output decision block 13. Additionally, at the multiplier 105, the filtered data is also multiplied by a multiplied symmetric imaginary data sample "Mulin" outputted from the adaptive filter 14 to generate another multiplied data sample "Mulout" which is relayed to the adaptive filter 14 shown in FIG. 2. Further, a weight data "Addin" outputted from the adaptive filter 14 can be added to the adder 107 in order to compensating a certain phase difference between a real and an image data samples.

Figure 4:
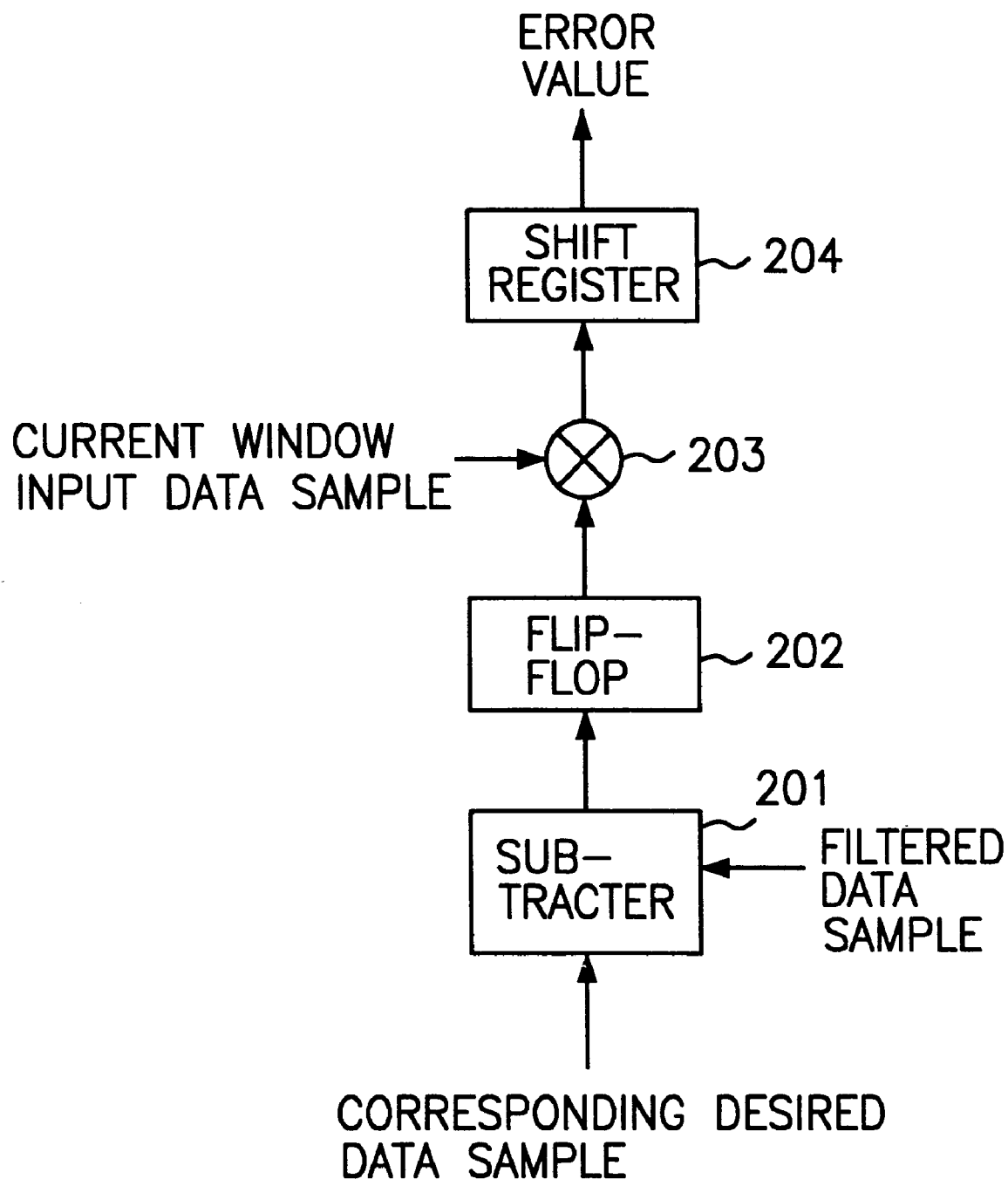
FIG. 4 provides a detailed block diagram of the filter coefficient updater shown in FIG. 2.

Referring to FIG. 4, there is shown a schematic block diagram of the filter coefficient updater 12 in accordance with the present invention. The filter coefficient updater 12 employs a least mean value algorithm. In this case, an updated filter coefficient is represented as follows:

$$W_{k+1} = W_k - \mu \epsilon_k X_k$$

wherein $W_{k+1}$ is an updated filter coefficient; $W_k$ is a current filter coefficient; $\mu$ is a convergence factor; $\epsilon_k$ is an error signal; and $X_k$ is a current window data sample.

The updated filter coefficient, which is used for a next filtering operation, is obtained by subtracting the current filter coefficient with an error value, wherein the error value is obtained by multiplying the convergence factor by the current window data sample and the error signal. The error signal represents a difference between a filtered data sample and a corresponding desired data sample. Therefore, the filter coefficient updater 12 receives the filtered data sample and the current window data sample outputted from the adaptive filter 11 to generate the error value. The error value is then coupled to the filter coefficient memory 103 as described above.

That is, as shown in FIG. 4, a subtracter 201 calculates a different between the filtered data sample and the corresponding desired data sample to generate an error signal representing the difference. The error signal is then fed via flip flop 202 to a multiplier 203 in which the error signal is multiplied by a current window data sample to generate a multiplied error signal. And then, the multiplied error signal is relayed to the shift register 204, wherein it is multiplied by a convergence factor through the use of a shifting operation to thereby generate an error value. The error value is then supplied to the filter coefficient memory 104 shown in FIG. 3 in order to obtain a newly updated filter coefficient.

By using the inventive adaptive equalizer, the more simplified and cost effective controller therefor can be implemented since the filter input circuit, e.g., an input data memory and the filter coefficient, for the adaptive filter having a filter multiplier and an accumulate, can be more effectively constructed only by using a number of delay means in a circular structure.

While the present invention has been described with respect to certain preferred embodiments only, other modifications and variations may be made without departing from the spirit and scope of the present invention as set forth in the following claims.

What is claimed is:

1. An equalizer for filtering a received signal to generate a filtered signal, wherein the received signal includes a plurality of data samples and the filtered signal includes a corresponding plurality of filtered data samples, said the equalizer comprising:

data supply means, receiving the filtered signal, for generating N number of window data samples on a symbol-by-symbol basis by using (N+1) number of delay means arranged in a circular structure, N being a positive integer;

multiply means for multiplying a window data sample with a current filter coefficient to generate a multiplied sample;

accumulation means for accumulating the multiplied output sample to generate an accumulated sample;

decision means for determining whether the accumulated sample approximates a desired sample and, if so, for generating a filtered data sample based on the accumulated sample;

error generation means for generating an error value based on an error signal, the current filter coefficient and the current window input sample, wherein the error signal represents a difference between the accumulated sample and the desired sample; and filter coefficient supply means, having N number of delay means, for subtracting the error signal from the current filter coefficient to generate the updated filter coefficient and providing the updated filter coefficient as the current filter coefficient.

2. The equalizer as recited in claim 1, wherein the data supply means includes:

N number of D flip flop connected in a series fashion;

a D flip flop connected in parallel to an Nth D flip flop, an output thereof being coupled to the error generation means; and multiplexer means, in response to a selection signal, for relaying an output from the Nth D flip flop or the received signal to the filtering means and a first D flip flop.

3. The equalizer as recited in claim 2, wherein the filter coefficient supply means includes N number of D flip flops in a series fashion; and a subtracter connected between a first and a second D flip flops.

4. The equalizer as recited in claim 3, wherein the error generation means includes:

a subtracter for generating the error signal represents a difference between the accumulated sample and the desired sample;

a multiplier for multiplying the error value with an output from the Nth D flip flop to generate a multiplied error signal; and a shift register for shifting the multiplied error signal to generate the error value.

* * * * *